(12) United States Patent
Miyoshi

(10) Patent No.: US 6,372,977 B1
(45) Date of Patent: Apr. 16, 2002

(54) ELECTRONIC APPARATUS WITH A SOLAR BATTERY

(75) Inventor: Kozo Miyoshi, Saitama (JP)

(73) Assignee: Citizen Watch Co., Ltd., Kawasaki (JP)

( * ) Notice: Subject to any disclaimer, the term of this patent is extended or adjusted under 35 U.S.C. 154(b) by 0 days.

(21) Appl. No.: 09/600,067

(22) PCT Filed: Nov. 10, 1999

(86) PCT No.: PCT/JP99/06247

§ 371 Date: Jul. 10, 2000

§ 102(e) Date: Jul. 10, 2000

(87) PCT Pub. No.: WO00/28513

PCT Pub. Date: May 18, 2000

(30) Foreign Application Priority Data

Nov. 10, 1998 (JP) ............................................. 10-318686

(51) Int. Cl.$^7$ ................................................ H01L 25/00
(52) U.S. Cl. ...................... 136/246; 136/256; 136/291; 368/205; 368/223
(58) Field of Search ................................ 136/246, 256, 136/291; 368/205, 223

(56) References Cited

U.S. PATENT DOCUMENTS

| | | | | |
|---|---|---|---|---|
| 3,757,511 A | * | 9/1973 | Burgess et al. | ............ 368/205 |
| 4,240,021 A | * | 12/1980 | Kashima et al. | ............ 136/291 |
| 6,180,871 B1 | * | 1/2001 | Campbell et al. | ............ 136/258 |

FOREIGN PATENT DOCUMENTS

| | | |
|---|---|---|
| JP | 57-94964 | 6/1982 |
| WO | WO00/38020 | 6/2000 |
| WO | WO00/58796 | 10/2000 |

* cited by examiner

*Primary Examiner*—Mark Chapman
(74) *Attorney, Agent, or Firm*—Greer, Burns & Crain, Ltd.

(57) ABSTRACT

In the case of using a solar battery formed by growing an amorphous silicon film on a substrate as a watch face for an electronic watch, there had been great restrictions with regard to the design of the watch face. If it is possible to impart transparency to light to the substrate onto which is formed a solar battery, so that it is possible to achieve a form of solar battery that is not perceivable, it is possible, by using a substrate onto which is formed this solar battery either on the watch face or on a protective glass crystal or the like, to achieve a watch with a solar battery not restricted with respect to watch face design.

40 Claims, 15 Drawing Sheets

Fig. 2
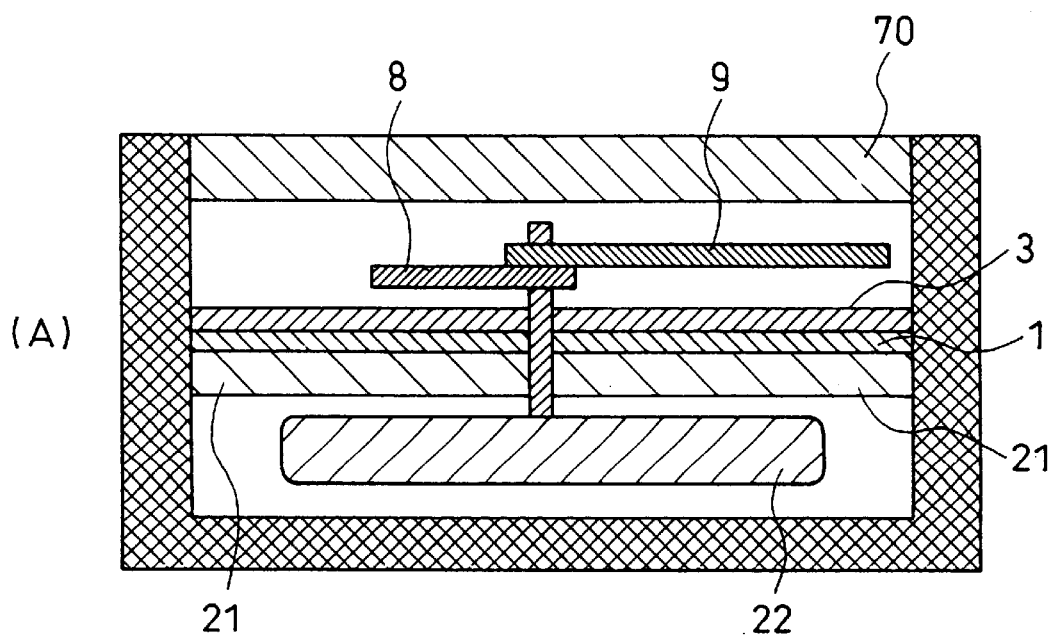
(A)
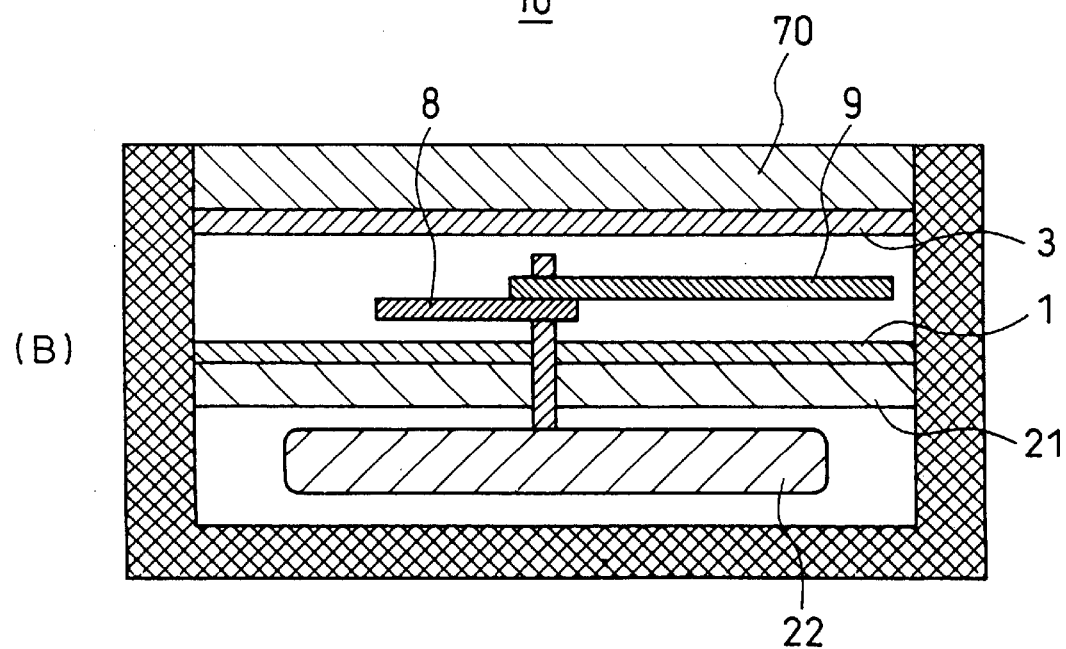
(B)

Fig. 15
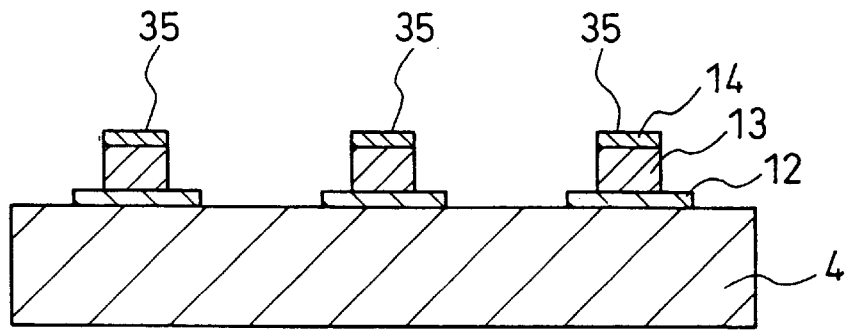
Fig. 16
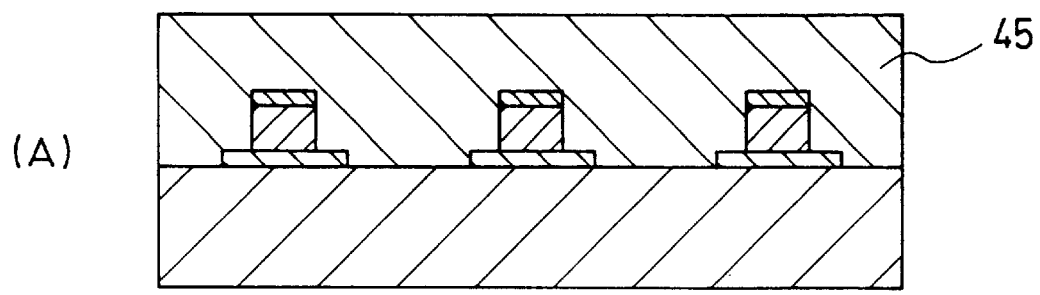
(A)
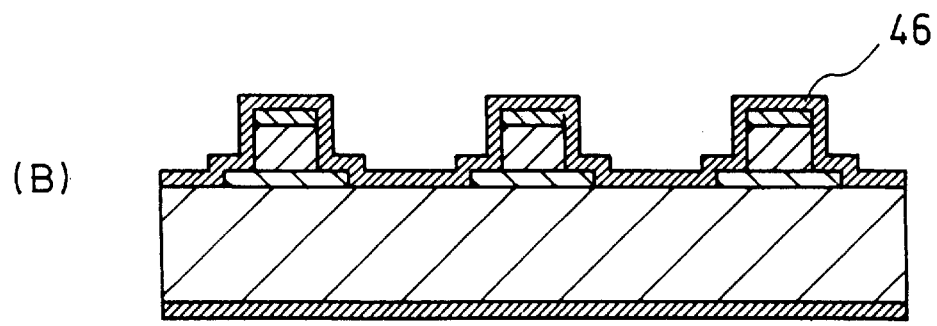
(B)

Fig. 17
(A)
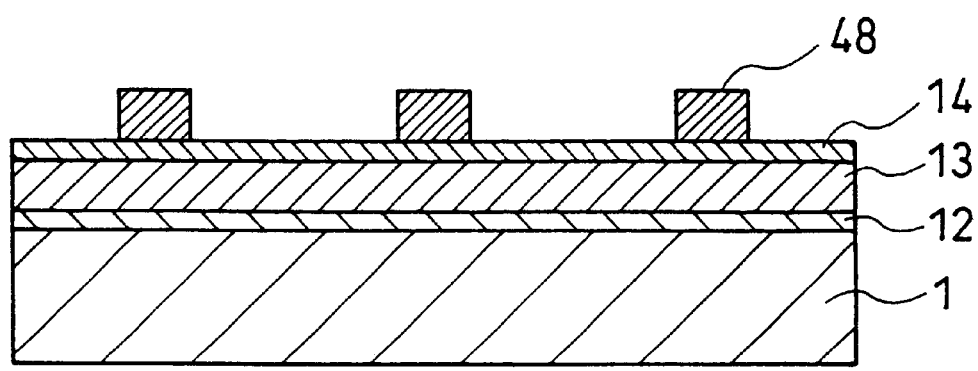
(B)
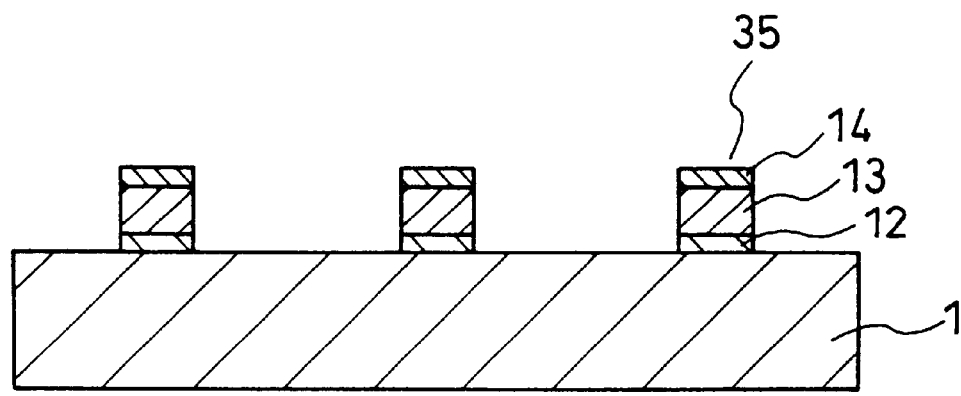

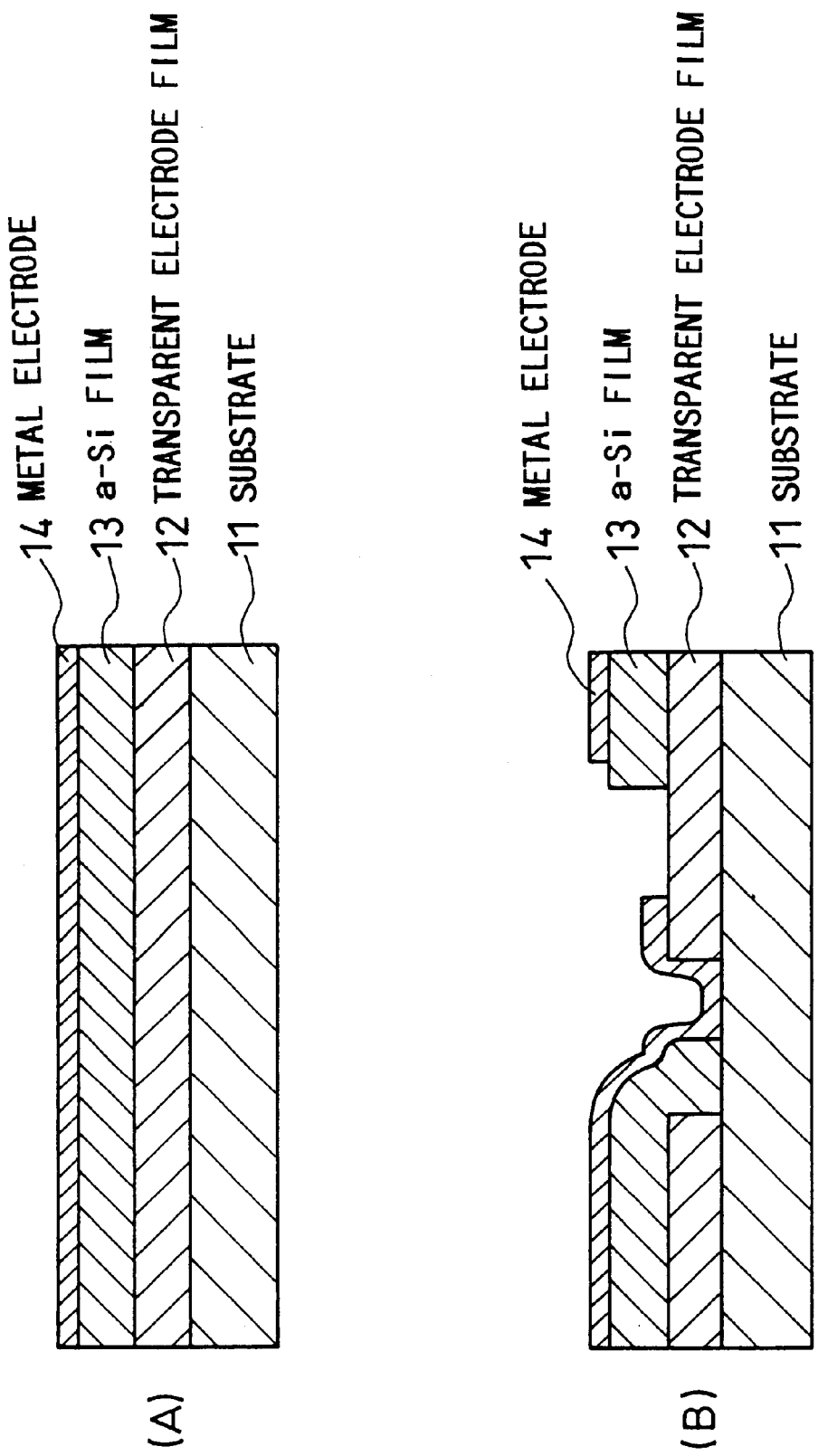

ELECTRONIC APPARATUS WITH A SOLAR BATTERY

FIELD OF THE INVENTION

The present invention relates to an electronic apparatus, and more specifically to an electronic apparatus with a combination of a solar battery and an information display means.

BACKGROUND ART

In the case in which a solar battery is used as a primary cell of an information display that includes an electronic watch, a solar battery module is often positioned at the watch face, in order to receive light for conversion to electrical energy.

That is, as shown in FIG. 3, a solar battery module 3, made up of a solar battery formed on a substrate, is disposed at the position of a watch face 4, this being used as the watch face as is. Light is converted to electrical energy and used to charge a secondary cell such as a nickel-cadmium battery, electrical energy from the secondary cell being extracted so as to drive the watch.

Another means, as shown in FIG. 4, is one in which a solar battery module 3 is disposed below the watch face 4. In either case, in a solar battery module that obtains an electromotive force obtained from four solar battery elements, the shape shown in FIG. 9 is usually used.

In the configuration of a solar battery shown in FIG. 9, as shown in FIG. 10, the electrodes 5 of the four solar batteries 6 are connected by using an extended electrode from part of the electrodes, electromotive force being extracted from output electrode 7 and 7' provided at these ends.

In a solar battery 6 of the past, as shown in FIG. 19(A), solar battery 6 is formed by laminating, onto a transparent substrate 11, electrodes 12 and 14 and, for example, a P-I-N type amorphous silicon layer 13, wherein, because the electromotive force occurring during operation is limited to 0.5 V or so, for use as a power supply in an electronic watch, it is not possible with one element 6 to charge a secondary cell such as a nickel-cadmium battery.

Given the above, the structure adopted is one in which a plurality of solar batteries 6 are disposed on the substrate 11, these elements 6 being connected in series so that the electromotive forces thereof are added, thereby generating a voltage that charges a secondary battery.

FIG. 19(B) is a schematic representation of the connection structure of the solar battery 6. This solar battery 6 is formed by forming a transparent conductive film 12 onto a glass substrate 11, onto which is then formed a P-I-N type amorphous silicon film (hereinafter abbreviated a-Si film), and further onto which is formed a metal electrode film 14.

An electromotive force generated because of the light incident from below the substrate 11 can be extracted from the transparent conductive film 12 and the metal electrode film 14 that surround the a-Si film 13 on both sides.

The laminate structure on the top of the substrate 11 is divided between left and right at substantially the center in FIG. 19(B), and both sides thereof are other solar battery element regions, the left and right sides being called element A and element B, respectively, for the purpose of the description herein.

The metal electrode film 14 of the element A and the transparent electrode film 12 of the element B are linked, thereby connecting the solar battery elements 6 and 6' in series.

At locations other than FIG. 19(B) as well, there is the same type of connection between the metal electrode film 14 and the transparent conductive film 12 of adjacent elements 6 and 6', thereby making a series connection between a plurality of solar battery elements 6 and 6' formed on the substrate 11, so as to form a solar battery with the desired electromotive force.

A method for manufacturing a solar battery such as noted above is described below, with reference to FIG. 19(A) and FIG. 19(B).

First, as shown in FIG. 19(A), a transparent conductive film 12 is formed on the substrate 11. This is, for example, an SnO2 film formed by a CVD process.

Then, laser machining is done of the SnO2 film so as to pattern it to the desired electrode shape. Next, a CVD process is used to laminate an a-Si film 13 onto the transparent conductive film 12, this being then laser machined to pattern the desired shape.

Additionally, a metal film that will serve as the metal electrode film 14 is sputtered onto the transparent conductive film 12 and the a-Si film 13, and the metal electrode film 14 is again laser machined to obtain the desired patterning shape for an electrode.

A solar cell such as shown in FIG. 9 or FIG. 10 having a connection cross-sectional structure as shown in FIG. 19(B) is completed in this manner. The cross-sectional construction other than the connection part is as shown in FIG. 19(A).

The relationship between the information display means of the past and a solar battery module including a solar battery 6 is one in which, with an opaque solar battery 6 of a special color, for example, it is difficult to use this at the surface of an information display means of an electronic apparatus including a watch face or liquid-crystal display of an electronic watch.

For example, the general approach is to form this integrally with the watch face, or to dispose it on the lower side of the watch face and, for that purpose, for example, in the case of a watch face, holes are appropriately formed in the watch face, so that sunlight can strike the solar battery 6, or the solar battery 6 itself is made a blackish color or other color that does not stand out, with the solar battery 6 itself being visible to the outside.

Another past example is, as shown in FIG. 11, one in which a solar battery 6 is annularly disposed around the periphery of the watch face.

In a watch configured as noted above, however, the watch becomes special and more costly, and is either limited in application or limited in the quantity that will be sold.

In the same manner, in an information display means other than a watch, such as an electronic apparatus in which a solar battery 6 drives a display means that uses a liquid crystal, it is impossible to dispose an opaque solar battery on the surface of the liquid-crystal display means, and difficult to form holes in the liquid-crystal display for the purpose of causing sunlight to pass therethrough.

Additionally, as a method to solve the above-noted technological problems, there has been a proposal for a watch or a liquid-crystal display in which a solar battery is formed linearly with a fine width on a transparent substrate, so that the solar battery is formed so as to cover the upper surface of a information display so as to be invisible to the human eye.

In the prior art, however, there was merely a vague indication of this configuration, and neither a technical basis nor disclosed data to indicate just what dimension would produce a desirable effect, the prior art, therefore, not going beyond the realm of an idea.

In a watch with a solar battery of the past as described above, in the case in which a solar battery module is disposed as the watch face, the presence of the solar battery module imposes restrictions with regard to watch face design.

Even if the solar battery module is disposed below the watch face, the watch face must have transparency to light, thereby being restricted with regard to materials and design, meaning that it is not possible to use a watch face with various materials and designed.

If it were possible to impart transparency to light to a solar battery module 3 formed by a solar battery 6 on a substrate, and also form the solar battery 6 so that it not visible to the human eye, it would be possible to use a solar battery module 3 formed by a solar battery 6 on a substrate on an information display such as a liquid-crystal display or watch face, or in a protective glass crystal, thereby enabling the fabrication of an electronic apparatus, such as a solar battery watch, without restrictions imposed with regard to design of the watch face or liquid-crystal display.

Additionally, if the configuration is made so that efficient opto-electromotive force is obtained with a solar battery formed as linear elements with even a finer width, it is possible not only to increase the amount of electricity generated, but also to make the solar battery smaller.

Accordingly, it is an object of the present invention to improve on the above-noted problems of the past, by providing an electronic apparatus with an information display means driven by a solar battery, wherein, a solar battery in the shape of a linear strip of fine width that cannot be seen by the human eye is formed on a transparent substrate and covers minimally a part of the surface of a prescribed information display.

DISCLOSURE OF THE INVENTION

In order to achieve the above-noted objects, the present invention has the following basic technical constitution. Specifically, an electronic apparatus with a solar battery according to the present invention is an electronic apparatus in which the major portion of an information display surface of an information display means is covered by a transparent substrate having a solar battery, wherein the solar battery is formed on the transparent substrate as a linear element of fine width so that the major transparent part of the transparent substrate is not blocked thereby, the solar battery being formed so that it protrudes minimally at one main surface of the transparent substrate, the transparent substrate having the solar battery being disposed on the side of the direction of light incidence with respect to the information display means, and the solar battery formed so as to protrude from the transparent substrate being formed so as to oppose the information display means on the transparent substrate.

That is, in a electronic apparatus according to the present invention, there is particular use of a side wall formed in the longitudinal direction of the solar battery to collect more incident light, thereby efficiently generating electricity, by making the configuration such that the solar battery protrudes from the upper surface of the transparent substrate.

Another aspect of the present invention is a solar battery module, in which a solar battery is formed on a surface of a transparent substrate, the solar battery being formed as a linear element of fine width, so that a major transparent part of the transparent substrate is not blocked thereby, the solar battery being formed so that it protrudes minimally at one main surface of the transparent substrate.

Yet another aspect of the present invention is a watch with a solar battery, in which the above-noted solar battery module is disposed on the watch face.

BRIEF DESCRIPTIONS OF THE DRAWINGS

FIG. 2(A) is a cross-sectional view showing an example of the configuration of a watch with a solar battery according to the present invention, and FIG. 2(B) is a cross-sectional view showing another example of the configuration of a watch with a solar battery according to the present invention.

FIG. 14(A) through FIG. 14(C) are drawings illustrating the a method for manufacturing a solar battery module of the present invention.

FIG. 15 is a drawing showing an example of a solar battery module obtained using the present invention.

FIG. 16(A) and FIG. 16(B) are drawings showing another example of a solar battery module in the present invention.

FIG. 17(A) and FIG. 17(B) are drawings showing an example of a different solar battery module in the present invention.

FIG. 18(A) through FIG. 18(G) are drawings showing a method of configuring the connection part of the electrodes in a solar battery module of past.

FIG. 19(A) and FIG. 19(B) are drawings which show an example of a method for configuring the connection part of the electrodes in a solar battery module of the past.

DETAILED DESCRIPTION OF THE PREFERRED EMBODIMENTS

A specific example of an electronic apparatus with a solar battery according to the present invention is described below in detail, with reference made to the drawings.

Figure 1:
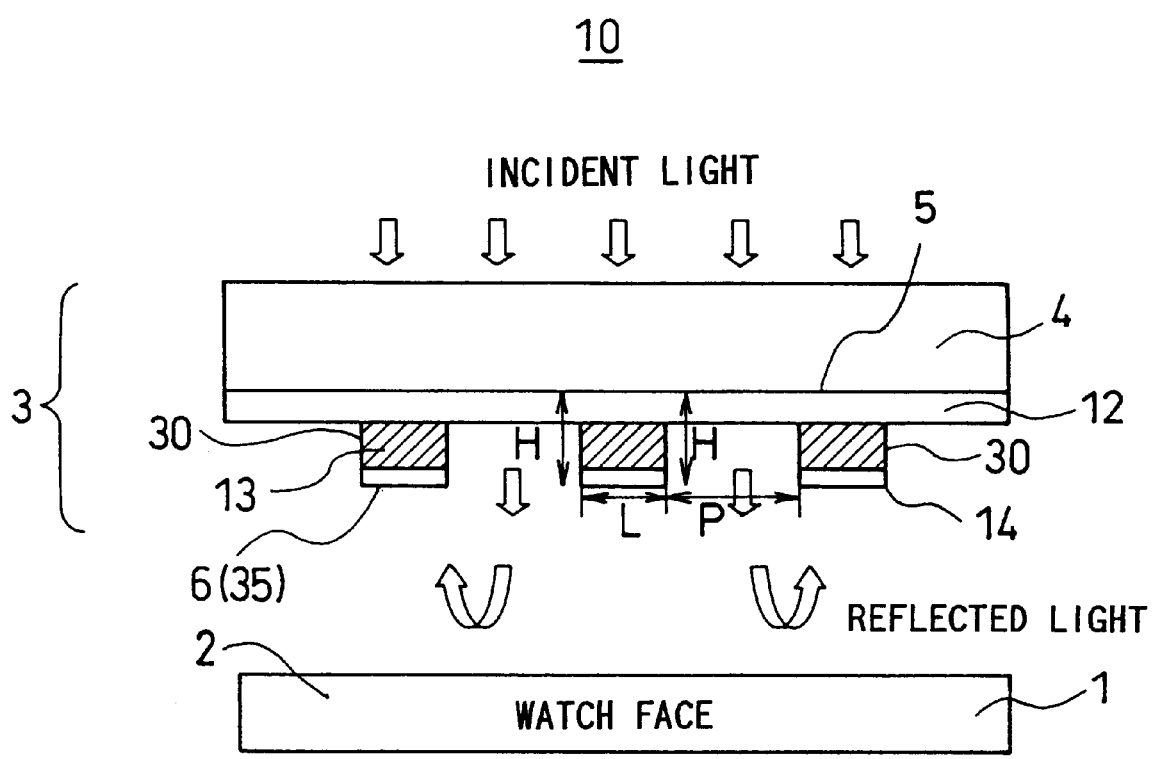
FIG. 1 is a cross-sectional view showing an example of the configuration of an electronic apparatus with a solar battery according to the present invention.
Figure 3:
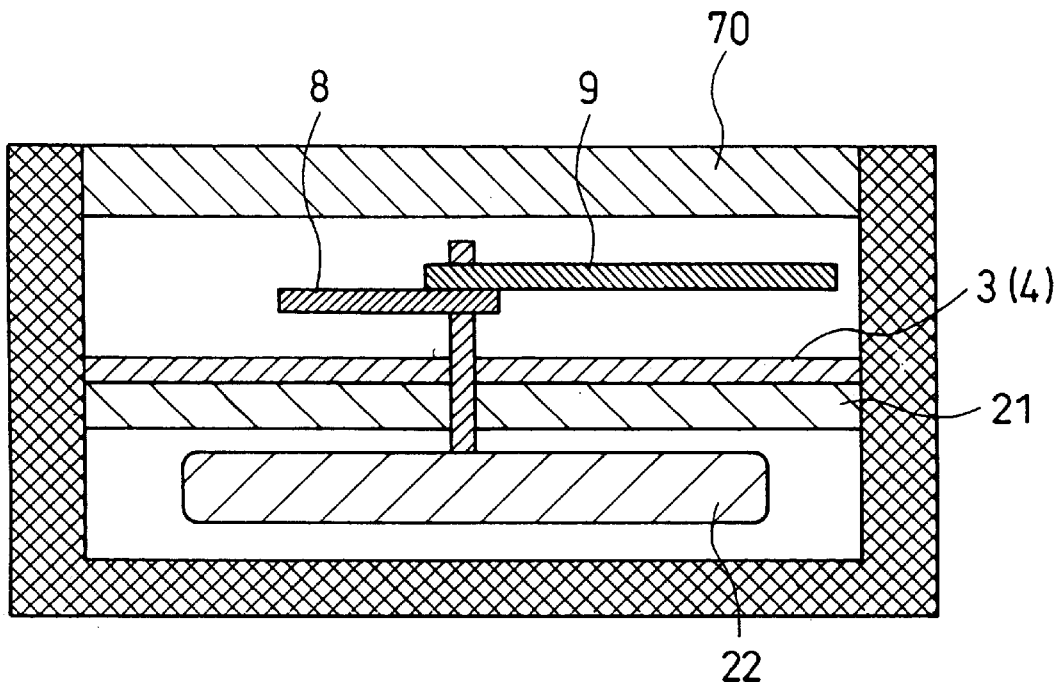
FIG. 3 is a cross-sectional view showing an example of the configuration of a watch with a solar battery of the past.
Figure 4:
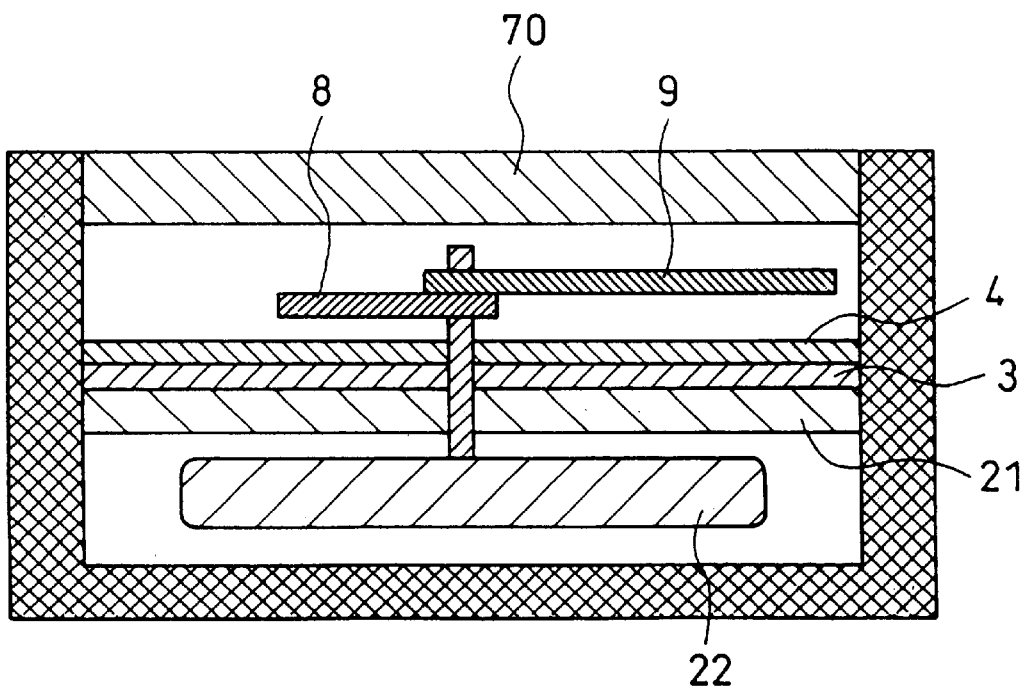
FIG. 4 is a cross-sectional view showing another example of the configuration of a watch with a solar battery of the past.

Specifically, FIG. 1 through FIG. 3 are drawings showing an example of the configuration of an electronic apparatus according to the present invention, FIG. 1 showing an electronic apparatus 10 in which the major portion of the surface of an information display 2 of an information display means 1 is covered by a solar battery module 3 formed by a transparent substrate 4 having a solar battery 6, wherein the solar battery 6 is formed on the transparent substrate 4 as a linear strip of fine width, so as not to block a major transparent portion of the transparent substrate 4, the solar battery 6 being formed so as to protrude minimally one main surface of the transparent substrate 4, a solar battery module 3 formed by the transparent substrate and including the solar battery 6 being disposed on the side of the direction on incidence of light from a light source such as sunlight, fluorescent light, or other light energy with respect to the information display means 1, and the solar battery 6 that is formed so as to protrude from the transparent substrate 4 being formed on a surface 5 opposing the information display means 1 on the transparent substrate 4.

FIG. 2(A) shows an electronic watch 10, in which the information display means 1 is a watch face, wherein the solar battery module 3 is disposed over the watch face 1 provided under the hour and minute hands 8 and 9 within the protective glass 70 on at least part, and preferably over the entire surface of the watch face 1.

In FIG. 2(A), although not clearly shown, it is preferable that there be some distance between the information display means 1 and the solar battery module 3 that is formed by a transparent substrate 4 that includes a solar battery 6.

FIG. 2(B) shows a configuration in which a solar battery module 3 such as shown in FIG. 3 is attached inside the protective glass so that the surface at which the solar battery 6 protrudes is opposite the watch face.

In FIG. 2(A) and FIG. 2(B), 21 denotes a support of the watch face 1, and 22 denotes a movement having a drive motor for the hour and minute hands.

In the electronic apparatus 10 with a solar battery according to the present invention, as noted above, it is desirable that a major portion of the information display surface of the information display means 1 be covered by the transparent substrate 4 having a solar battery 6, the solar battery 6 being formed on the transparent substrate 4 so as not to block a major transparent portion of the transparent substrate 4.

Although not specified, it is desirable that the information display means 1 be one type selected from a group of, for example, a liquid-crystal display, a display panel comprising numerals and graphics, and the face of a watch.

Therefore, a digital or analog watch is an example an electronic apparatus 10 of the present invention.

Each of the solar batteries 6 of the present invention is required to be formed so as to protrude from the transparent substrate 4 and, as a result, the side wall 30 of the solar batteries 6 is configured to serve as a light-incidence section.

That is, the side wall 30 of a solar battery 6 in the present invention is configured so that part of the sunlight passing through the transparent substrate 4, or reflected light from the information display means 1 is incident thereto. By adopting this configuration, in addition to sunlight or light from another light source incident to, for example, an amorphous silicon layer that serves as electrical generating layer 13, via the transparent substrate 4 and a transparent electrode film 12 in contact with the transparent substrate 4, in the same manner light energy from the side wall 30 of the solar battery 6 is taken into the electrical generating layer 13, thereby enabling the maximum opto-electromotive force in the solar battery 6.

The electrode 14 provided at the edge part of the protrusion in the solar battery 6 of the present invention can be a metal electrode, and can also be a transparent electrode 14 such as the transparent electrode 12.

It is desirable that the protruding height (H) of the solar battery 6 from the transparent substrate 4 be such that, the total of the heights on both sides of the solar battery 6, (H1+H2), on both side walls formed in the longitudinal direction of the solar battery 6 is 1% or more, preferably being 1% to 30%, of the total of the length (H1+H2)+(L) summing up a length L of a portion of a cross-sectional area protruding from the transparent substrate and formed perpendicular to the longitudinal direction of said solar battery and which being substantially parallel to said transparent substrate, and a total of the two heights (H1+H2) corresponding to the side walls on both sides thereof.

Additionally, in the present invention, the solar batteries 6, as shown in FIG. 5 through FIG. 8, are formed as linear elements 35 having a width that is fine enough that they are not visible to the eye, the plurality of narrow linear elements 35 being disposed either mutually parallel or adjacent with a prescribed spacing therebetween.

The width L of the linear elements 35 and the placement spacing P of each linear element 35 are desirably established to satisfy the condition that the linear elements 35 in the solar battery module 3 that includes the solar batteries are not visible to the human eye.

The narrow linear elements 35 used in the present invention are preferably linear or curved.

It is desirable that the transmissivity of the solar battery module 3 on which are formed a plurality of solar batteries 6 used in the present invention be 70% or greater.

That is, it is desirable in the present invention that the width L of the narrow linear elements which are the solar batteries be as narrow as possible, and that the spacing between the narrow linear elements 35 be as wide as possible.

However, because making the narrow linear elements extremely narrow increases their resistance, thereby hindering the electrical generating effect, it is desirable this width have a narrow-side limit of approximately 8 $\mu$m.

Figure 12:
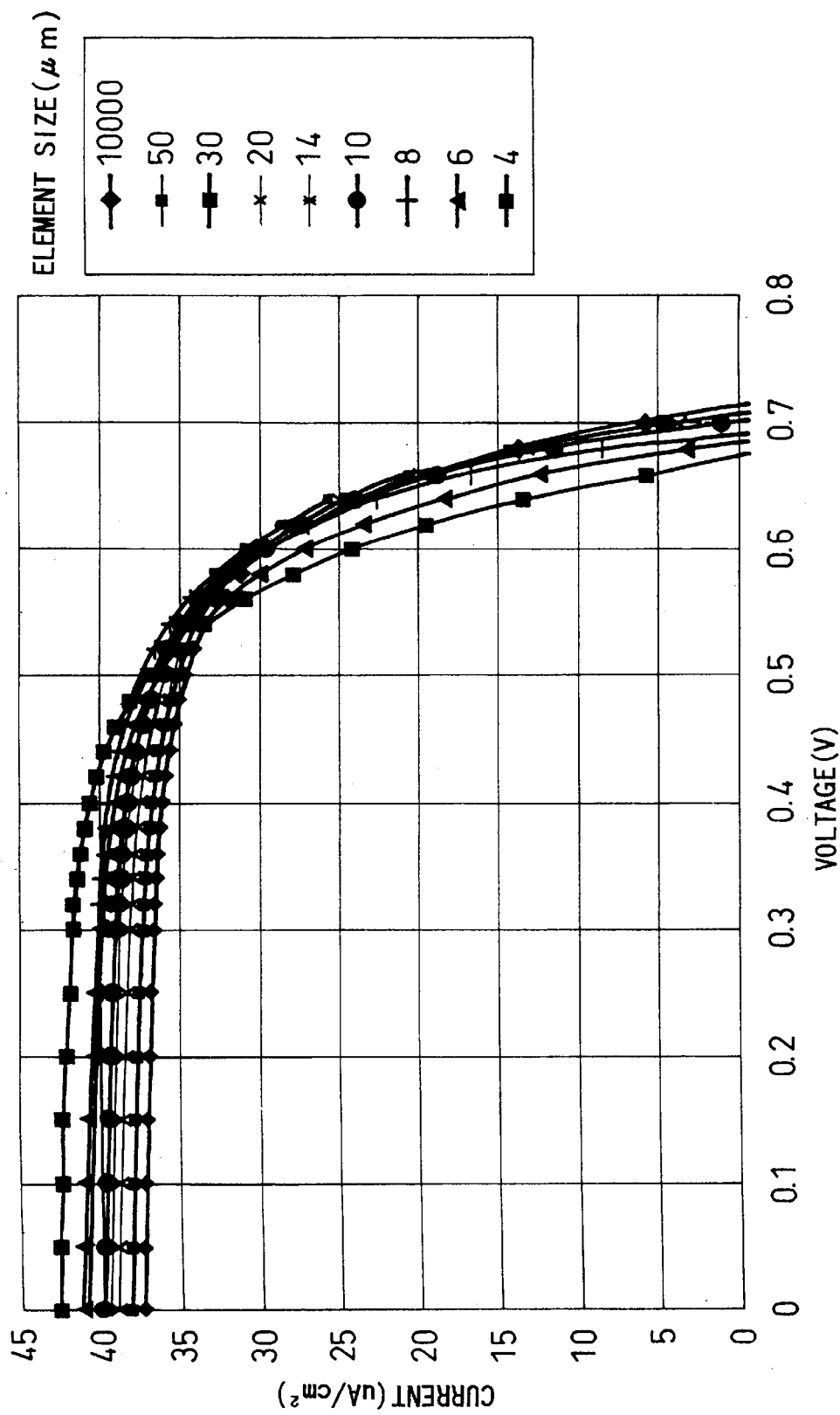
FIG. 12 is a graph showing the relationship between the element size of the solar battery in the present invention and the electrical characteristics thereof.

FIG. 12 is a graph showing the voltage-versus-current relationship when the width of the narrow linear elements 35 making up the solar battery in the present invention is varied (the case in which the element size (um) is changed), these results obtained by a comparison experiment in which the height (H) of the narrow linear elements 35 was held fixed at 0.5 $\mu$m.

As can be understood from FIG. 12, the smaller the size of these elements is made, the better is the current efficiency per unit of surface area.

This is thought to be because of a large amount of light that is incident to the solar battery 6 from the side walls.

However, if the element size of the solar battery 6 becomes smaller than 6 $\mu$m, process damage causes noticeable deterioration in the element characteristics, and it is thought that the limit value is approximately 8 $\mu$m.

Considering the above-noted experimental results, it is desirable that the width L of the narrow linear elements 35 making up the solar batteries in the present invention be 200 $\mu$m or smaller, and further that preferably L be 20 $\mu$m or smaller.

Figure 13:
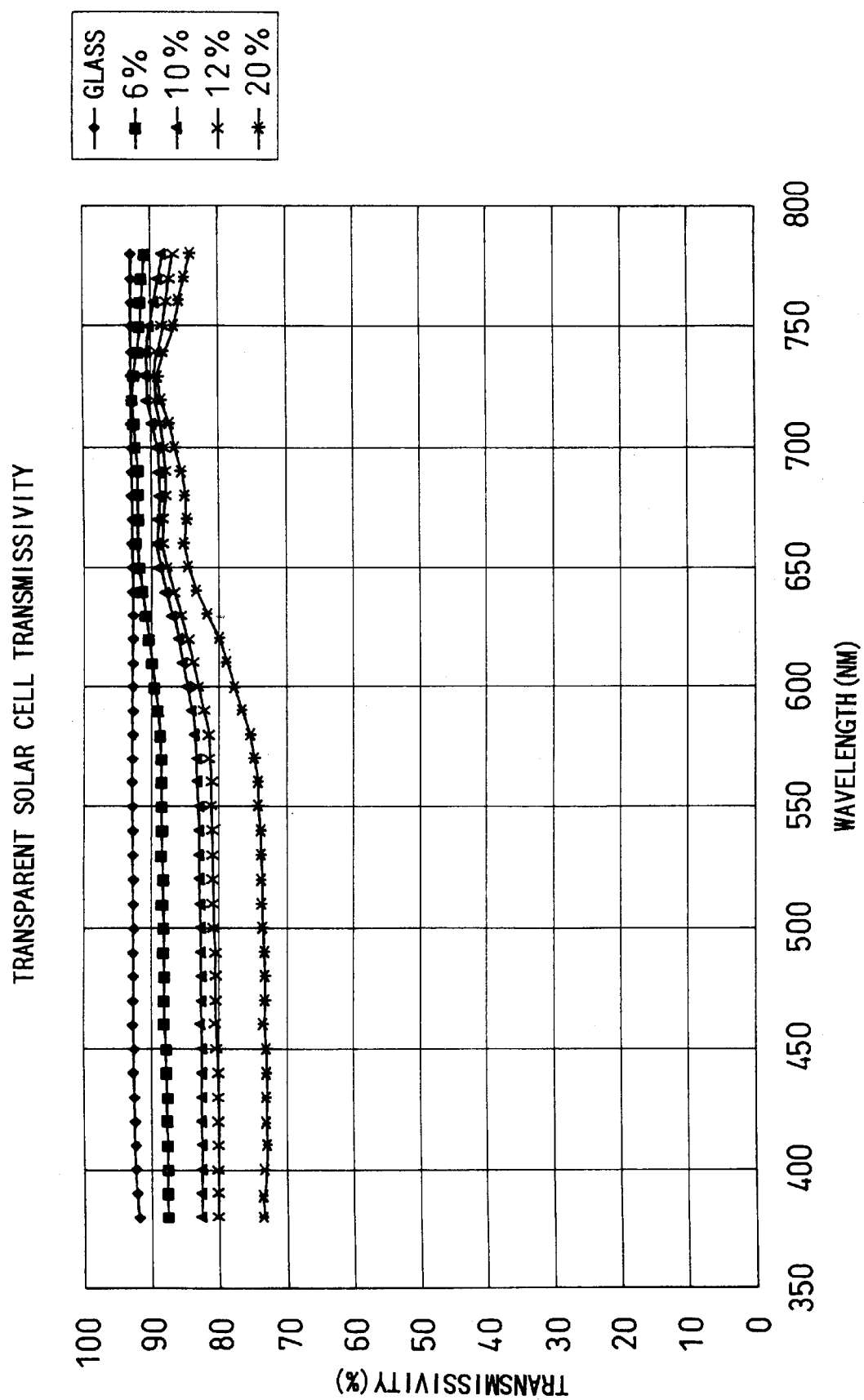
FIG. 13 is a graph showing the relationship between the surface area occupied by the solar battery in the present invention and the light transmissivity.

FIG. 13 is a graph showing the relationship between the portion of the transparent substrate 4 occupied by the solar batteries 6 and the optical transmissivity, from which it can be understood that, even when the total surface area of the narrow linear elements 35 represents 20% of the total surface area of the transparent substrate 4, the light transmissivity is still above 70%.

It is undesirable that the total surface area of the narrow linear elements 35 is greater than 20% of the total surface area of the transparent substrate 4, it is not preferable because the light transmissivity of the transparent substrate 4 falls below 70%.

It is desirable in the present invention that the mutual spacing P between narrow linear elements 35 making up the solar batteries, be at least 100 µm.

It is desirable that a group of narrow linear elements disposed in a solar battery module 3 be mutually connected in parallel, and straight-line linear elements 35 can be disposed so as to be mutually parallel, while curved narrow linear elements 35 can be disposed so as to be mutually parallel or mutually concentrically with a prescribed spacing therebetween.

Figure 5:
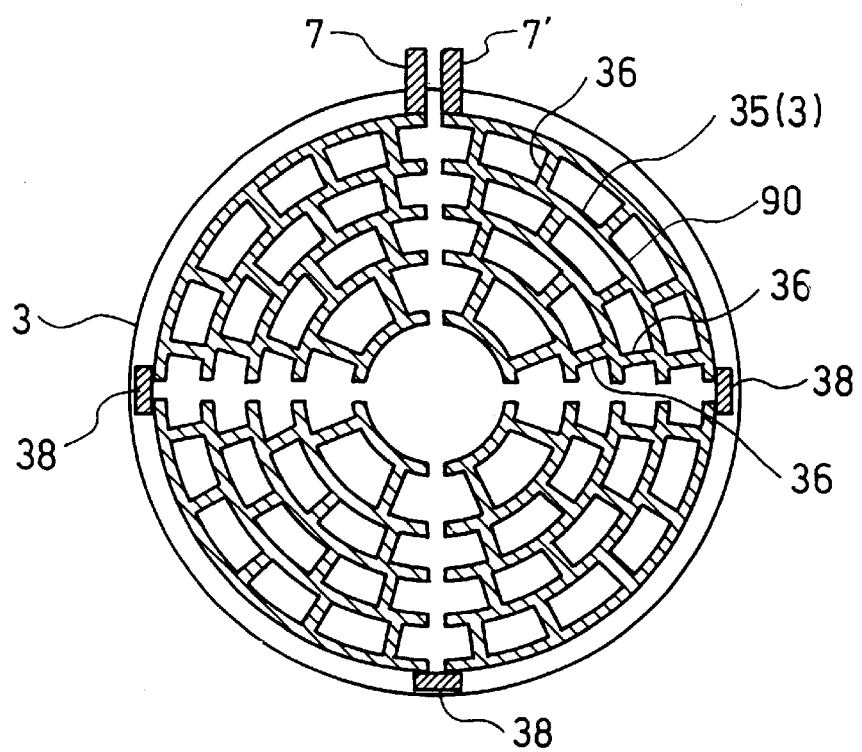
FIG. 5 is a plan view showing an example of the configuration of a solar battery module according to the present invention.

For example, FIG. 5 shows an example of the disposition solar batteries 6 formed by linear elements 35 formed in a solar battery module 3, in which a plurality of arc-shaped curved narrow linear elements are concentrically arranged, with bridges 36 making connections between individual curved narrow linear elements 35.

That is, the placement pattern of the narrow linear elements 35 in FIG. 5 is that of a spider' web.

Figure 6:
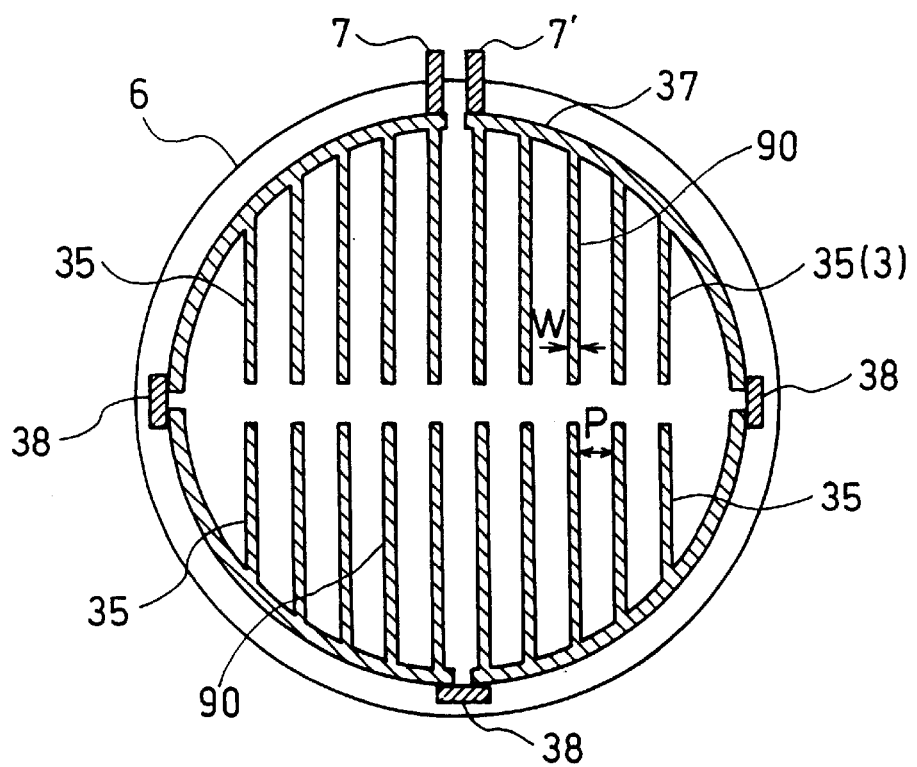
FIG. 6 is a plan view showing another example of the configuration of a solar battery module according to the present invention.

FIG. 6 shows another example of a solar battery module 3 in the present invention, wherein a group of narrow linear elements 35 formed on the transparent substrate 4 is formed by mutually different groups thereof, there being four groups in the case of this example, the narrow linear elements 35 that make up each of the groups being mutually parallel, with the base parts thereof being connected by an electrode 37, an appropriate connection electrode 38 making a series connection between these groups.

Figure 7:
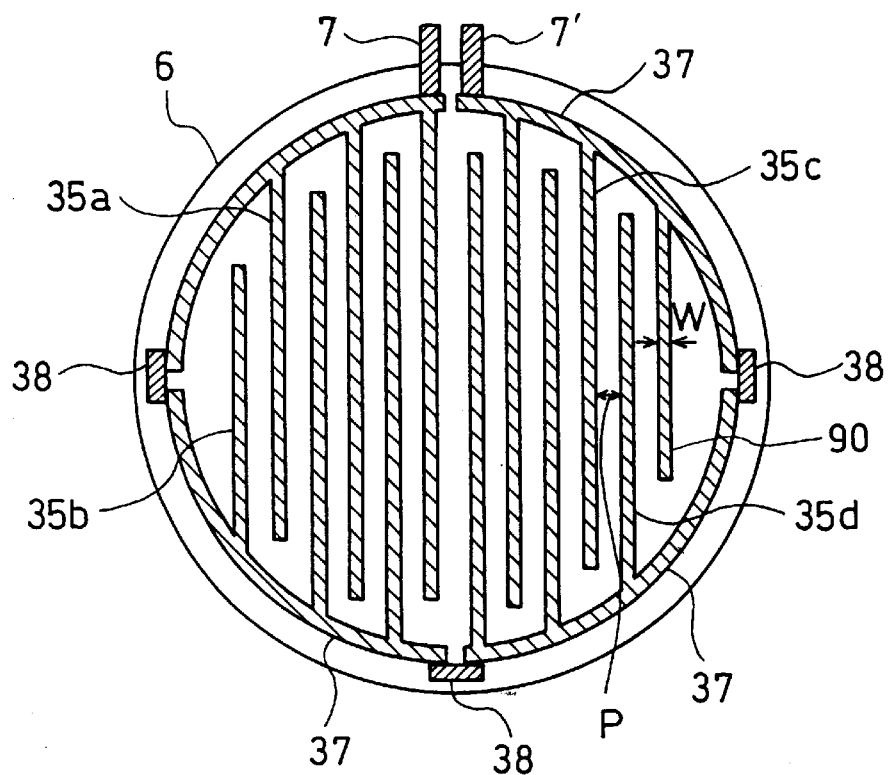
FIG. 7 is a plan view a different example of the configuration of a solar battery module according to the present invention.

FIG. 7 shows another configuration of the solar battery module 3 of the present invention, in which narrow linear elements 35 formed on a transparent substrate 4 such as in the example of FIG. 6 are divided into four groups, wherein a plurality of narrow linear elements 35a, which are mutually parallel and form one group, are mutually interleaved with a plurality of narrow linear elements 35b, which are mutually parallel and form another group.

Figure 8:
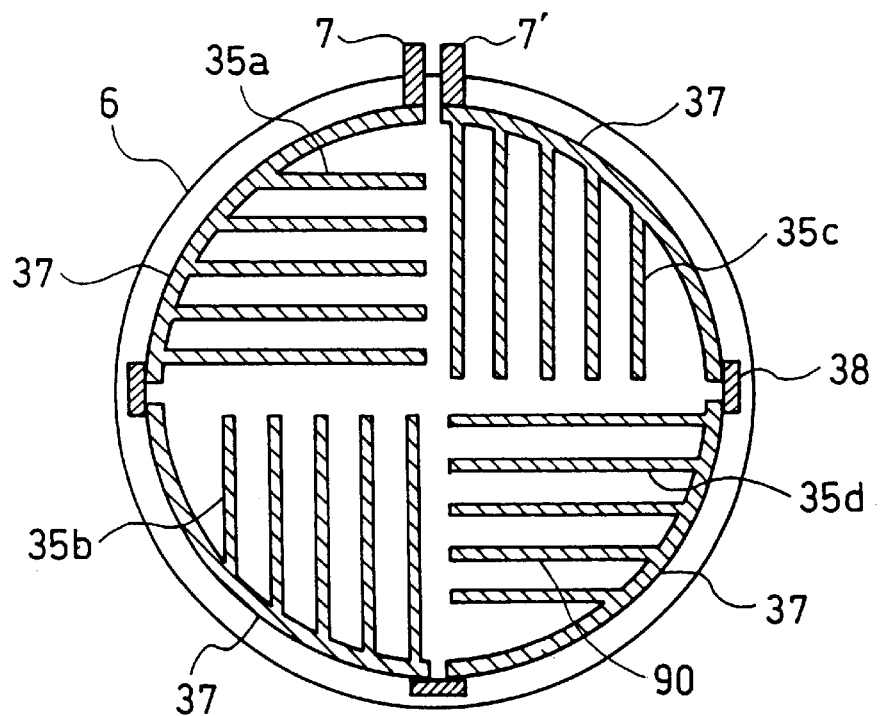
FIG. 8 is a plan view showing yet another example of the configuration of a solar battery module according to the present invention.
Figure 9:
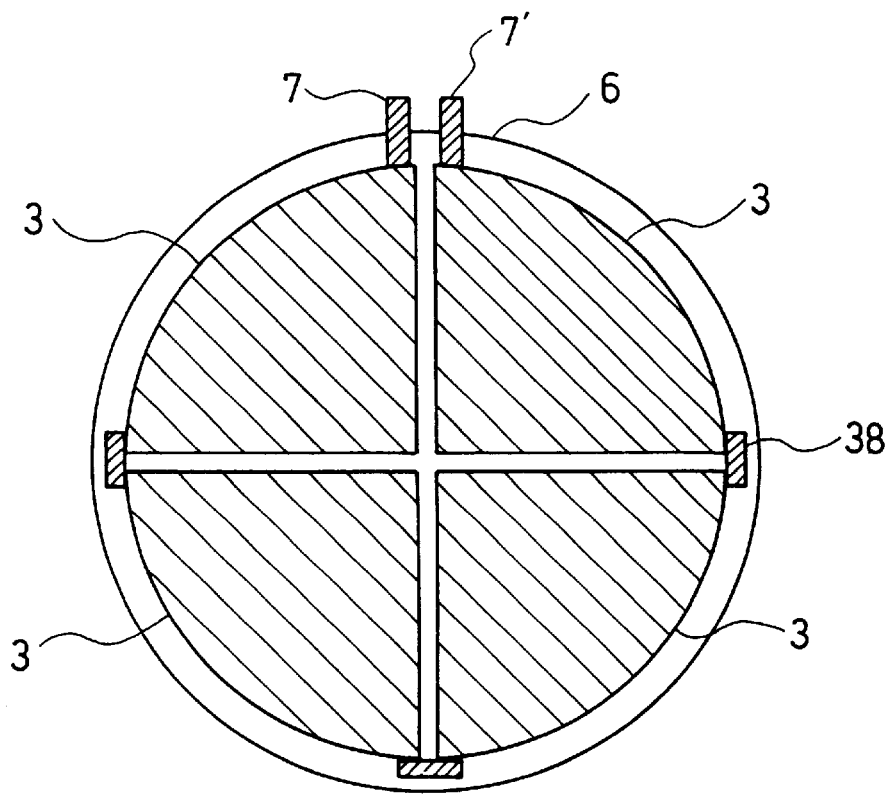
FIG. 9 is a plan view showing an example of a solar battery module of the past.
Figure 10:
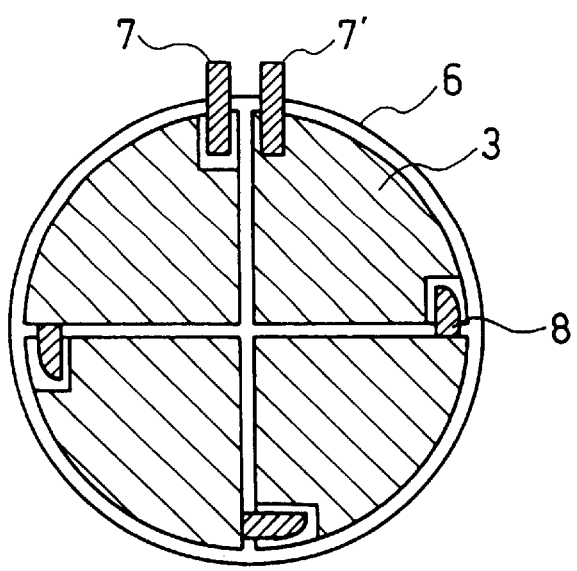
FIG. 10 is a plan view showing another example of a solar battery module of the past.
Figure 11:
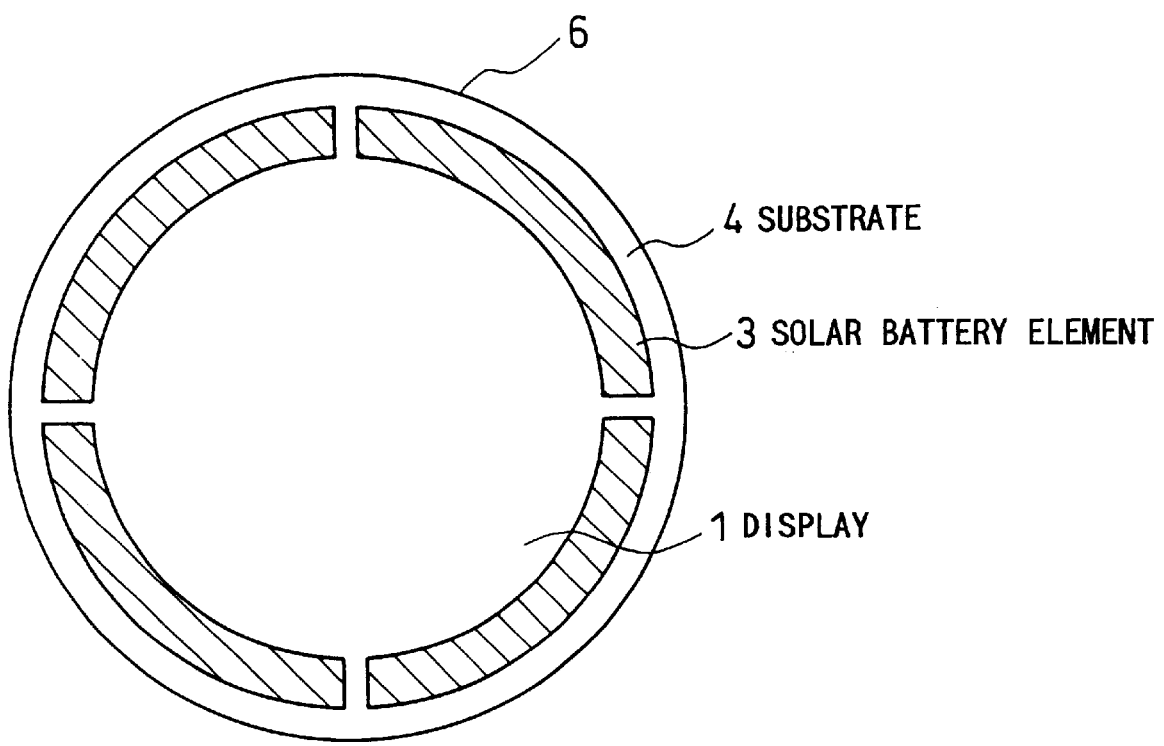
FIG. 11 is a plan view showing a different example of a solar battery module of the past.

FIG. 8 shows a different configuration of the solar battery module 3 of the present invention, in which a plurality of narrow linear elements 35 formed on a transparent substrate 4 such as in the example of FIG. 6 are divided into four groups, wherein a plurality of narrow linear elements 35c, which are mutually parallel and form one group, and a plurality of narrow linear elements 35d, which are mutually parallel and form another group, are disposed so that the arrangement directions thereof are mutually different, the difference in angle of arrangement therebetween being 90 degrees in this example.

In the same manner, the arrangement directions of all adjacent groups differ by 90 degrees.

The electrical generating layer 13 that is surrounded by the two electrodes 12 and 14 in the solar battery 6 of the present invention can be single-crystal silicon, or can also be an amorphous silicon film, and can also be made of any other material, as long as the material has opto-electromotive force.

It is desirable that the surface of the information display means in the electronic apparatus 10 of the present invention be configured so that it can efficiently reflect incident sunlight.

Specifically, it is desirable that the configuration be such that it is easy to reflect light at the surface of either the liquid-crystal display means or the watch face.

In the present invention, it is preferable that the solar battery module 3 be disposed below the protective glass crystal of the watch or the like, that is, on the surface on the opposite side from the side of sunlight incidence, this being the surface facing the information display means 1.

In the present invention, by adopting the above-described configuration, the solar battery elements become invisible to the naked eye, light passing through parts on which the solar battery elements are not formed making it possible to verify a member on the rear surface of the solar battery module onto which is formed the solar batteries from the outside of the solar battery module. Therefore, when using this solar battery on a protective glass crystal of a watch, it is possible to fabricate a solar battery watch without restriction placed on the design.

Furthermore, in the present invention, the electromotive force of the solar battery 6 itself can be increased over a solar battery of the past and, by doing so, it is possible not only to lengthen the drive time, but also to make the solar battery itself smaller.

A method of configuring a solar battery module 3 that includes a solar battery 6 and a transparent substrate 4 according to the present invention, as shown in FIG. 1, is described in detail below.

In the present invention, a transparent substrate made of glass, plastic, or the like is used as a substrate for forming the solar batteries.

The method used to fabricate the solar battery is that of first, as shown in FIG. 14(A), growing a transparent conductive film 12 onto the substrate 4, and then using a photolithography process (hereinafter simply referred to as lithography) to form a resist pattern 40 thereover.

The case in which indium tin oxide (ITO) is used as the transparent conductive film 12 is described herebelow.

First, an ITO 12 film is formed by sputtering. The sputtering conditions when this is done are introduction of argon gas at 100 sccm and oxygen gas at 2 sccm into the sputtering apparatus chamber, a pressure within the chamber of 5 mTorr to 30 mTorr, and application of 1 kW to 3 kW of high-frequency power (13.56 MHz) to form a plasma.

Next, as shown in FIG. 14(B), the above-noted resist film 40 is used as a mask pattern to etch the transparent conductive film 12.

The etching of the ITO film 12 is done by dry etching using a processing agent that is a 3:5:2 mixture of ferric oxide, hydrochloric acid, and water.

After the above, as shown in FIG. 14(C), the resist is first peeled away, thereby forming an a-Si film 13 and the ITO film that is the upper electrode film 14 onto the surface of the transparent substrate 4 and the transparent electrode 12. The upper electrode film 14 can be a metal film made of titanium, aluminum, or the like, and it is desirable that this be a transparent conductive film in order to make use of reflected light from the watch face as well in generating electricity.

The a-Si film is grown using a plasma CVD process. When this is done, to form a P-type a-Si film 13, silane gas at 500 sccm and diborane gas at 0.1 sccm to 1 sccm are introduced into the plasma CVD apparatus chamber, the pressure in the apparatus chamber being 0.5 Torr to 2 Torr, and 50 W to 300 W of high-frequency electrical power (13.56 MHz) being applied to generate a plasma so as to break down the gas, the substrate being placed on an electrode at a temperature of 250° C.

To grow an I-type a-Si film 13, silane gas is introduced into the plasma CVD apparatus chamber at 500 sccm, the pressure within which is 0.5 Torr to 2 Torr, and 50 W to 300 W of high-frequency electrical power is applied (13.56 MHz) so as to generated a plasma to break down the gas, the substrate 1 being placed on an electrode at a temperature of 250° C.

To grow an N-type a-Si film 13, silane gas at 500 sccm and phosphene gas at 0.1 sccm to 1 sccm are introduced into the plasma CVD apparatus chamber, the pressure within which is 0.5 Torr to 2 Torr, 50 W to 300 W of high-frequency electrical power (13.56 MHz) being applied to as to generate a plasma to break down the gas, the substrate being placed on an electrode at a temperature of 250° C.

Over the above, a resist pattern 41 is formed, using photolithography. This resist pattern 41 is used as an etching mask to etch the ITO film and the a-Si film, thereby obtaining a configuration such as shown in FIG. 15.

Additionally, in the present invention, as shown in FIG.16(A) and FIG. 16(B), the surface of the solar battery module 3 can be covered by a protective film 45, or by an antireflection film 46 having a reflectance lower than that of the base.

The resist pattern 41 has as its first purpose that of extracting a lower electrode, its second purpose being that of forming the electrical generating part and display part. By forming this resist pattern in the shapes such as shown in FIG. 5, FIG. 6, FIG. 7, and FIG. 8, it is possible to form a solar battery module 3 having an electrical generating part 6.

When forming the pattern of the ITO which serves as the lower electrode film 14, if parts other than the extraction electrode are made the same resist pattern, the transmissivity at the display part is increased.

The etching of the ITO is done as described above, using dry etching, etching of the a-Si film 13 being done continuously in this dry etching apparatus.

The etching of the a-Si film 13 is done by introducing SF6 at 100 sccm to 300 sccm and C12 gas at 0 sccm to 100 sccm into the dry etching apparatus chamber, the overall pressure therein being 50 mTorr to 200 mTorr, and 100 W to 1000 W of high-frequency electrical power (13.56 MHz) being applied so as to generate a plasma.

Additionally, after stripping the resist pattern, the elements are connected in series using a conductive paste, so that a combined electromotive force is generated. Then, a transparent resin or the like is applied to the upper surface as a protective film, thereby completing a solar battery having a connection structure such as shown in FIG. 19(B).

FIG. 17(A) and FIG. 17(B) show another example of a method for manufacturing a solar battery module 3 of the present invention. As shown in FIG. 17(A), first a transparent electrode 12, an a-Si film 13 and a transparent electrode as a lower electrode are formed on a transparent substrate 1, over which an appropriate resist 48 is formed, this resist being appropriately patterned, the resist pattern 48 being used as a mask, as shown in FIG. 7(B), to perform simultaneous etching of the transparent electrode 12, the a-Si film 13, and the transparent electrode 14, thereby forming the narrow linear elements 35 that make up the solar battery 6.

Figure 18:
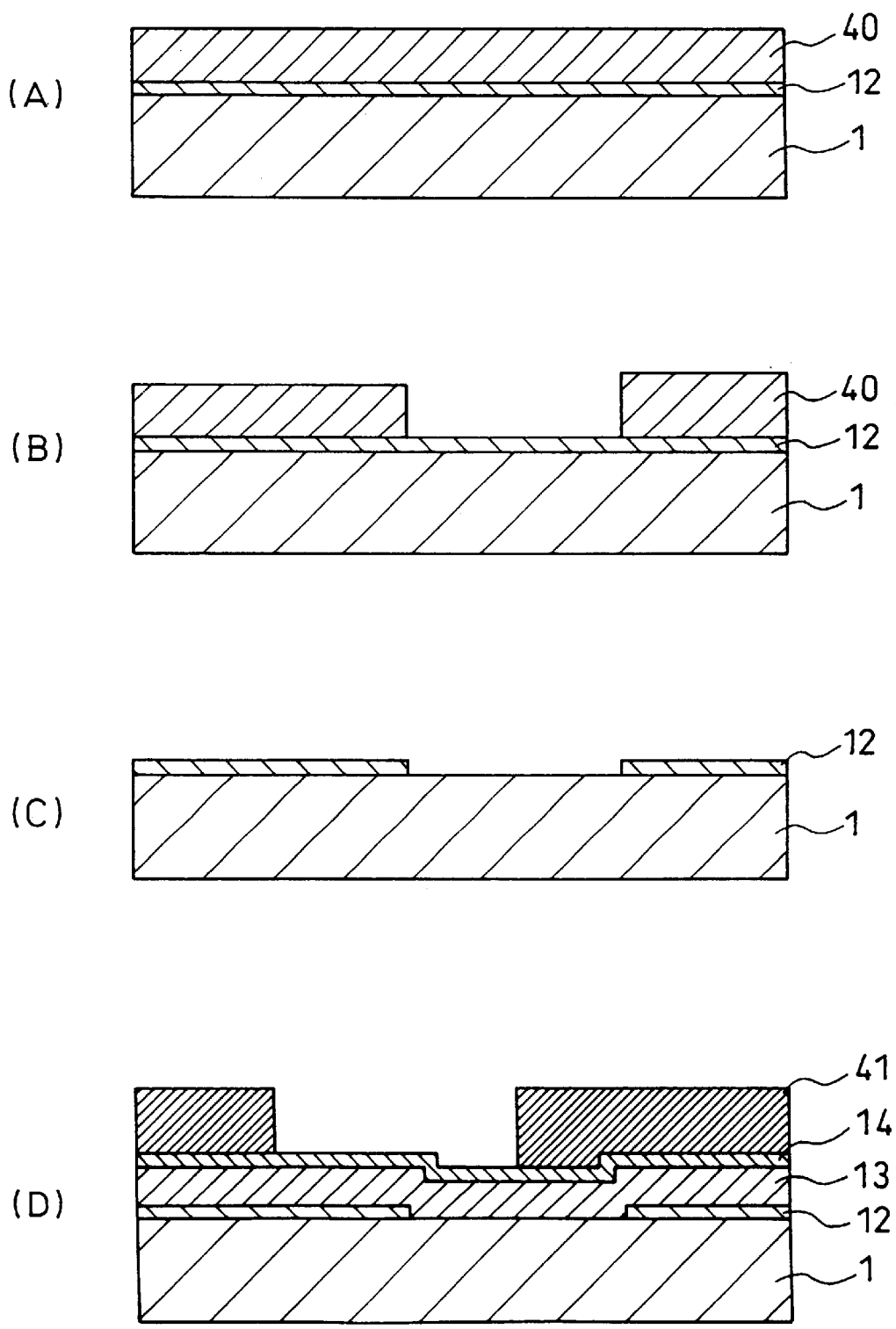
Figure 18:
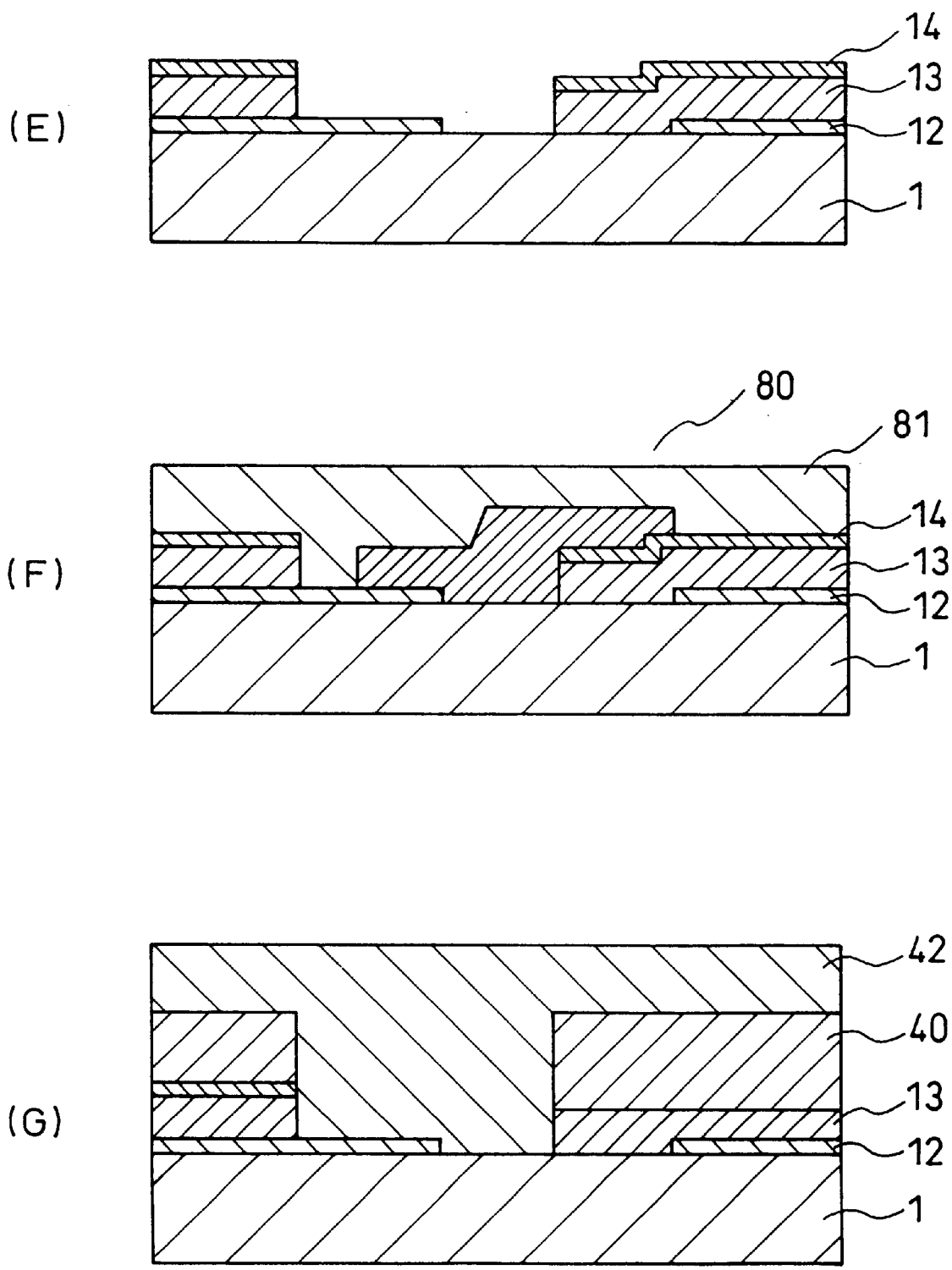

FIG. 18(A) through FIG. 18(G) are drawings showing an example of a method for forming a connection electrode between adjacent solar batteries 6 wherein, as shown in FIG. 18(B), an ITO 12 film is grown as a lower electrode on the top of a glass substrate 1, over which is then formed a desired resist pattern 40.

This resist pattern is used as an etching mask to etch the ITO 12, the result being as shown in FIG. 18(C).

Figure 14:
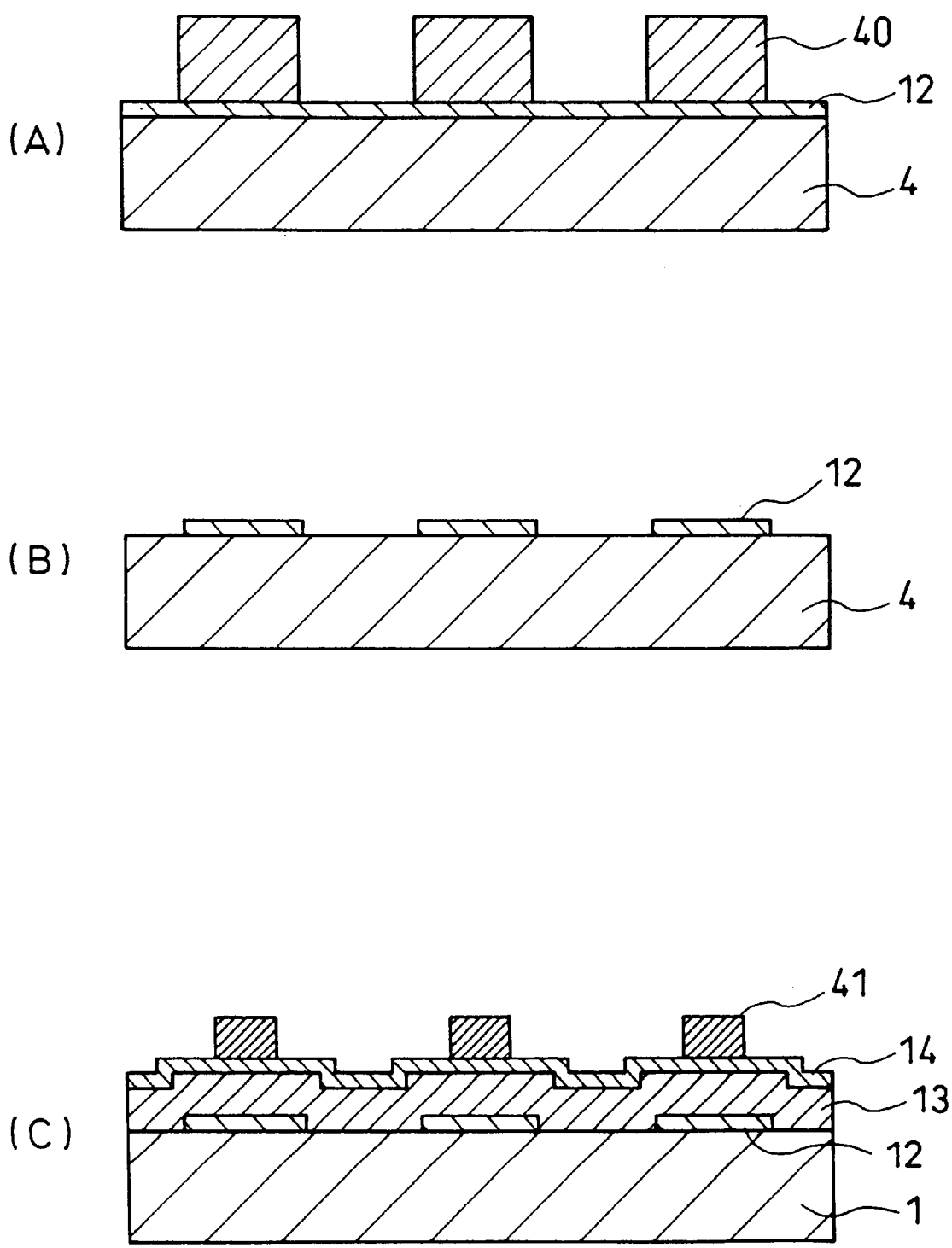

When this is done, if the solar battery is to be formed as shown in FIG. 15, the electrical generating area is made by forming a resist pattern such as shown in FIG. 14, and if the shape of FIG. 17(B) is to be obtained, the electrical generating area is covered entirely by resist, as shown in FIG. 18(B).

Next, after stripping the resist, the a-Si film 13 and ITO 12 to serve as the upper electrode are continuously grown, as shown in FIG. 18(D), over which a desired resist pattern 41 is formed.

Additionally, using this resist pattern 41 as an etching mask, the ITO upper electrode film 14 and a-Si film 13 are etched.

In a case in which the ITO film that serves as the lower electrode is etched to the same type of shape as indicated in FIG. 18(B), after etching, without peeling, a new resist pattern 42 is formed as a cover in only the joining parts shown in FIG. 18(G), and the ITO film is further etched in this condition.

In order to obtain the shape of FIG. 15, this process step is not necessary.

After the above, the resist is peeled away, a conductive paste 80 is used to join the lower electrode 12 and the upper electrode 14, and the protective film 81 is applied, thereby resulting in the structure of FIG. 18(F).

The dry etching of the ITO in this embodiment of the present invention is done, for example, by introducing HBr gas at 100 sccm to 200 sccm and argon gas at 0 sccm to 50 sccm into the dry etching apparatus chamber, the pressure within being 20 mTorr to 50 mTorr, and applying 1000 W to 2000 W of high-frequency electrical power (13.56 MHz) so as to generate a plasma.

The basic configuration of a solar battery module as noted above in the present invention is one in which a solar battery is formed on a transparent substrate surface, the solar battery having narrow linear elements so that a major transparent portion of the transparent substrate is not blocked, and the solar battery being formed so as to protrude from at least one main surface of the transparent substrate.

Therefore, it is desirable that the solar battery module of the present invention be covered with a transparent protective film, and further preferable that the side walls of the solar battery be configured so as to form a light incidence part.

Additionally, in the solar battery module of the present invention it is preferable that the plurality of narrow linear elements be disposed so as to be mutually parallel or adjacent with a prescribed spacing therebetween, and further it is required that the width of the narrow linear elements and the arrangement spacing between narrow linear elements be established so that the narrow linear elements in the solar battery be unperceivable by the human eye.

The narrow linear elements in the solar battery module of the present invention can be either straight line or curved, and it is desirable that the transmissivity of the solar battery be 70% or greater.

The width of the narrow linear elements that make up the solar battery module is 200 $\mu$m or smaller, and preferably 20 $\mu$m or smaller.

The spacing between the plurality of narrow linear elements making up the solar battery module of the present invention is preferably at least 50 $\mu$m.

Additionally, it is preferable that the design be such that the portion of surface area of the transparent substrate used in the solar battery module of the present invention that is occupied by the plurality of narrow linear elements be 20% or less.

If a solar battery module 3 configured as noted above is fabricated so that the portion of surface area occupied by elements is 20% and the display part surface area is 80%, 80% of the light is transmitted, making it usable as a watch face. When the element size is less than 100 microns, it becomes difficult to recognize with a human eye, thereby becoming substantially transparent. That is, it is possible to make the design with freedom, and no restrictions with regard to the watch face.

By designing the solar battery, it is possible to achieve a new watch with an added design on the watch face.

As described above, with the present invention, in a solar battery formed by growing an amorphous silicon film onto a substrate, by making the minimum width of the amorphous silicon 200 $\mu$m, so that it is not perceivable with the naked eye, it is possible to impart transparency to the substrate onto which the solar battery is formed, thereby enabling the manufacturing of a solar battery applicable to any industrial product in which a design is required.

What is claimed is:

1. An electronic apparatus in which a major portion of an information display means is covered by a transparent substrate having a solar battery, said solar battery being formed on said transparent substrate as a plurality of narrow linear elements, so as to not block a major transparent portion of the transparent substrate, and formed so that the solar battery protrudes minimally at one main surface of the transparent substrate.

2. An electronic apparatus in which a major portion of an information display means is covered by a transparent substrate having a solar battery, said solar battery being formed on said transparent substrate as a plurality of narrow linear elements, so as to not block a major transparent portion of the transparent substrate, and formed so that the solar battery protrudes minimally at one main surface of the transparent substrate, said transparent substrate that includes said solar battery being disposed on a light incidence side with respect to the information display means, and said solar battery formed so as to protrude from said transparent substrate on a surface of said transparent substrate opposing said information display means.

3. An electronic apparatus in which a major portion of an information display means is covered by a transparent substrate having a solar battery, said solar battery being formed on said transparent substrate as a plurality of narrow linear elements, so as to not block a major transparent portion of the transparent substrate, and formed so that the solar battery protrudes minimally at one main surface of the transparent substrate, said transparent substrate that includes said solar battery being disposed on a light incidence side with respect to the information display means, and said solar battery formed so as to protrude from said transparent substrate on a surface of said transparent substrate opposite from a surface opposing said information display means.

4. An electronic apparatus according to any one of claim 1 to claim 3, wherein the protruding height of said solar battery from said transparent substrate is such that the total of heights (H1+H2) on both sides of the solar battery on both side walls formed along a longitudinal direction of the solar battery is 1% to 30% of the total of a length (H1+H2+L) summing up a length L of a portion of a cross-sectional area protruding from the transparent substrate and formed perpendicular to the longitudinal direction of said solar battery and which being substantially parallel to said transparent substrate, and a total of the two heights (H1+H2) corresponding to the side walls on both sides thereof.

5. An electronic apparatus according to any one of claim 1 to claim 3, wherein said part of said solar battery protruding from said transparent substrate is covered by a transparent protective film.

6. An electronic apparatus according to any one of claim 1 to claim 3, wherein a side wall part of said solar battery forms a light-incidence part.

7. An electronic apparatus according to any one of claim 1 to claim 3, wherein a side wall part of said solar battery is configured so that part of a light that is transmitted through the transparent substrate or light reflected from the transparent substrate is incident thereto.

8. An electronic apparatus according to any one of claim 1 to claim 3, wherein said information display means is one type selected from a group of, a liquid-crystal display, a plate on a surface of which numerals or graphics are shown and an indicating board of a watch, or the like.

9. An electronic apparatus according to any one of claim 1 to claim 3, wherein said electronic apparatus is an electronic watch.

10. An electronic apparatus according to any one of claim 1 to claim 3, wherein said plurality of narrow linear elements are disposed so as to be mutually parallel or disposed so as to have a prescribed spacing therebetween.

11. An electronic apparatus according to any one of claim 1 to claim 3, wherein a width of said narrow linear elements and a spacing between said narrow linear elements are established so that said narrow linear elements are not perceivable to the human eye.

12. An electronic apparatus according to any one of claim 1 to claim 3, wherein said narrow linear elements are straight lines or curved lines.

13. An electronic apparatus according to any one of claim 1 to claim 3, wherein the transmissivity of said solar battery is 70% or greater.

14. An electronic apparatus according to any one of claim 1 to claim 3, wherein the width of said narrow linear elements forming said solar battery is 200 $\mu$m or smaller.

15. An electronic apparatus according to claim 14, wherein the width of said narrow linear elements forming said solar battery is 20 $\mu$m or smaller.

16. An electronic apparatus according to any one of claim 1 to claim 3, wherein the spacing between said plurality of narrow linear elements forming said solar battery is at least 50 $\mu$m.

17. An electronic apparatus according to claim 1 to claim 3, wherein a portion of a surface area of said transparent substrate occupied by said solar battery is 20% or less.

18. An electronic apparatus according to any one of claim 1 to claim 3, wherein said plurality of narrow linear elements formed on said transparent substrate are connected mutually in parallel.

19. An electronic apparatus according to any one of claim 1 to claim 3, wherein said plurality of narrow linear elements formed on said transparent substrate are divided into mutually different subgroups, the plurality of narrow linear elements in each individual said subgroup being connected mutually in parallel, and the plurality of subgroups being connected mutually in series.

20. An electronic apparatus according to claim 19, wherein said plurality of narrow linear elements disposed mutually parallel and forming one said subgroup is interleaved among said plurality of narrow linear elements disposed mutually parallel and forming another said subgroup.

21. An electronic apparatus according to claim 20, wherein said plurality of narrow linear elements disposed mutually parallel and forming one said subgroup is disposed so that the arrangement direction thereof is different from that of said plurality of narrow linear elements disposed mutually parallel and forming another said subgroup.

22. An electronic apparatus according to any one of claim 1 to claim 3, wherein said solar battery comprises a transparent first electrode layer disposed at a part in contact with the transparent substrate, an electrical generating layer provided in contact with said transparent electrode layer, and second electrode layer being a metal layer or a transparent layer provided in contact with said electrical generating layer.

23. An electronic apparatus according to claim 22, wherein both said first and second electrode layers of said solar battery are transparent layers.

24. An electronic apparatus according to claim 22, wherein said electrical generating layer is an amorphous silicon film.

25. An electronic apparatus according to any one of claim 1 to claim 3, wherein a surface of said information display means is configured so as to be able to reflect incident light.

26. A solar battery module in which a solar battery is formed on a surface of a transparent substrate, said solar battery having a plurality of narrow linear elements so as not to block a major transparent portion of said transparent substrate, and said solar battery being formed so as to protrude from at least one main surface of said transparent substrate.

27. A solar battery module according to claim 26, wherein said solar battery is covered by a protective film.

28. A solar battery module according to claim 26 or claim 27, wherein a side wall part of said solar battery is configured as a light-incidence part.

29. A solar battery module according to any one of claim 26 to claim 27, wherein said plurality of narrow linear elements are disposed so as to be mutually parallel or disposed so as to have a prescribed spacing therebetween.

30. A solar battery module according to any one of claim 26 to claim 27, wherein the width of said plurality of said narrow linear elements and a spacing between each said narrow linear elements are established so that said narrow linear elements in said solar battery is not perceivable to the human eye.

31. A solar battery module according to any one of claim 26 to claim 27, wherein said narrow linear elements are straight lines or curved lines.

32. A solar battery module according to any one of claim 26 to claim 27, wherein a transmissivity of said solar battery is 70% or greater.

33. A solar battery module according to any one of claim 26 to claim 27, wherein a width of said narrow linear elements forming said solar battery is 200 $\mu$m or smaller.

34. A solar battery module according to claim 33, wherein the width of said narrow linear elements forming said solar battery is 20 $\mu$m or smaller.

35. A solar battery module according to any one of claim 26 to claim 27, wherein the spacing between said plurality of narrow linear elements forming said solar battery is at least 50 $\mu$m.

36. A solar battery module according to any one of claim 26 to claim 27, wherein a portion of surface area of the transparent substrate occupied by said solar battery is 20% or less.

37. A solar battery module according to any one of claim 26 to claim 27, wherein said narrow linear elements formed on said transparent substrate are connected mutually in parallel.

38. A solar battery module according to any one of claim 26 to claim 27, wherein said plurality of narrow linear elements formed on said transparent substrate is divided into a plurality of subgroups, the plurality of narrow linear elements of each said subgroup being connected mutually parallel, and said subgroups being connected mutually in series.

39. A solar battery module according to claim 38, wherein said plurality of narrow linear elements disposed mutually parallel forming one said subgroup is interleaved between said plurality of narrow linear elements disposed mutually parallel and forming another said subgroup.

40. A solar battery module according to claim 38, wherein said plurality of narrow linear elements disposed mutually parallel and forming one said subgroup is disposed with an arrangement direction that is different from an arrangement direction of said plurality of narrow linear elements disposed mutually parallel and forming another said subgroup.

* * * * *

UNITED STATES PATENT AND TRADEMARK OFFICE
CERTIFICATE OF CORRECTION

PATENT NO.   : 6,372,977 B1
DATED        : April 16, 2002
INVENTOR(S)  : Miyoshi It is certified that error appears in the above-identified patent and that said Letters Patent is hereby corrected as shown below:

<u>Title page,</u>
Item [57], ABSTRACT, please delete:

"In the case of using a solar battery formed by growing an amorphous silicon film on a substrate as a watch face for an electronic watch, there had been great restrictions with regard to the design of the watch face. If it is possible to impart transparency to light to the substrate onto which is formed a solar battery, so that it is possible to achieve a form of solar battery that is not perceivable, it is possible, by using a substrate onto which is formed this solar battery either on the watch face or on a protective glass crystal or the like, to achieve a watch with a solar battery not restricted with respect to watch face design."

Please insert the following ABSTRACT:

-- An electronic device having an information disclosure is covered by a transparent substrate having a solar battery. The solar battery is formed on the transparent substrate as a plurality of narrow linear elements, so as to not block a major transparent portion of the substrate. The battery is also formed so that is protrudes minimally from one surface of the transparent substrate. --

<u>Column 4,</u>
Line 58, please delete "of past" and insert -- of the past --

<u>Column 14,</u>
Line 30, please delete "mutually parallel" and insert -- mutually in parallel --

Signed and Sealed this

Third Day of June, 2003

JAMES E. ROGAN
*Director of the United States Patent and Trademark Office*